US008497781B2

(12) United States Patent
Engelhardt et al.

(10) Patent No.: US 8,497,781 B2
(45) Date of Patent: Jul. 30, 2013

(54) POWER SUPPLY AND COMMUNICATIONS CONTROLLER

(75) Inventors: John Engelhardt, Greenwich, CT (US); Larry Fish, White Plains, NY (US)

(73) Assignee: Underground Systems, Inc., Armonk, NY (US)

( * ) Notice: Subject to any disclaimer, the term of this patent is extended or adjusted under 35 U.S.C. 154(b) by 907 days.

(21) Appl. No.: 11/665,660

(22) PCT Filed: Oct. 21, 2005

(86) PCT No.: PCT/US2005/038120
§ 371 (c)(1),
(2), (4) Date: Apr. 18, 2007

(87) PCT Pub. No.: WO2006/047384
PCT Pub. Date: May 4, 2006

(65) Prior Publication Data
US 2007/0290835 A1 Dec. 20, 2007

Related U.S. Application Data

(60) Provisional application No. 60/621,098, filed on Oct. 22, 2004.

(51) Int. Cl.
*G08B 1/08* (2006.01)
*G01R 1/00* (2006.01)

(52) U.S. Cl.
USPC ............ 340/870.01; 340/870.02; 340/270.17; 340/870.38; 324/126

(58) Field of Classification Search
USPC ............. 340/870.01, 870.02, 870.17, 870.38; 324/126
See application file for complete search history.

(56) References Cited

U.S. PATENT DOCUMENTS

| | | | | |
|---|---|---|---|---|
| 4,420,752 A * | 12/1983 | Davis et al. | ............. | 340/870.17 |
| 4,521,822 A * | 6/1985 | Simard | ............. | 361/35 |
| 4,799,005 A * | 1/1989 | Fernandes | ............. | 324/127 |
| 4,808,916 A * | 2/1989 | Smith-Vaniz | ............. | 324/110 |
| 4,855,671 A | 8/1989 | Fernandes | | |
| 4,904,996 A * | 2/1990 | Fernandes | ............. | 340/870.07 |
| 5,734,257 A * | 3/1998 | Schauder et al. | ............. | 323/207 |
| 5,905,346 A * | 5/1999 | Yamada et al. | ............. | 318/50 |
| 7,337,080 B2 * | 2/2008 | Doig et al. | ............. | 702/60 |
| 7,589,478 B2 * | 9/2009 | Ushijima et al. | ............. | 315/277 |
| 2002/0084914 A1 | 7/2002 | Jackson et al. | | |
| 2003/0058128 A1 | 3/2003 | Crunk | | |
| 2003/0122686 A1 | 7/2003 | Ehrke et al. | | |

(Continued)

FOREIGN PATENT DOCUMENTS

| EP | 0 314 849 A1 | 5/1989 |
|---|---|---|
| WO | WO 02/08771 A1 | 1/2002 |

*Primary Examiner* — Hai Phan
*Assistant Examiner* — Amine Benlagsir
(74) *Attorney, Agent, or Firm* — Frommer Lawrence & Haug LLP; William S. Frommer

(57) ABSTRACT

A power supply extracts electrical power from the electromagnetic field surrounding a high voltage power conductor and conditions the derived input power to provide a stable power source for instrumentation and communications equipment. The communications controller is a local network router that routes serial data traffic to selected communication devices such as an instrumentation processor, a power supply processor, or a maintenance port controller. The router forwards the data to other communications equipment and forwards data from the communicating equipment to an external network providing substantially simultaneous communications between the external network and the instrumentation processor, power supply processor and maintenance port controller.

3 Claims, 10 Drawing Sheets

U.S. PATENT DOCUMENTS

| | | |
|---|---|---|
| 2004/0095237 A1 | 5/2004 | Chen et al. |
| 2004/0135676 A1* | 7/2004 | Berkman et al. ......... 340/310.01 |
| 2005/0113060 A1* | 5/2005 | Lowery ........................ 455/402 |
| 2005/0212483 A1* | 9/2005 | Li ................................ 320/128 |
| 2006/0146866 A1* | 7/2006 | Horvath et al. ............... 370/464 |

* cited by examiner

POWER SUPPLY AND COMMUNICATIONS CONTROLLER

This application claims the benefit of priority of provisional application Ser. No. 60/621,098 filed Oct. 22, 2004.

BACKGROUND

This invention relates to a communication system. In particular, the communication system can communicate data associated with power transmission lines to remote systems.

Power line instruments can be mounted on a power line conductor to measure and analyze the values of particular parameters of overhead power line conductors. The performance of the power line may be determined from the values of the parameters. A communication system transmits the values measured by the power line instruments to local ground receiving stations dedicated to those instruments. The data from the various ground stations can be further transmitted to central control stations for analysis of the values of the parameters.

The values of parameters measured by the power line instruments can provide a measure of the performance of the power line conductor. The parameters associated with each conductor can describe the operational state of the power conductor and include sensing the voltage, current, phase angle, temperature, sag and the other parameters of the associated conductor. The measured quantities are communicated to one or more ground-based processors. Power for the power line instruments can be derived from the electro-magnetic field associated with the power line conductor. When power is conducted through the power line conductor a magnetic field sets up around the conductor. The magnetic field can be used to induce a current and voltage in a power supply. The induced current and voltage can be used for powering the power line instruments including the communication system.

SUMMARY OF THE INVENTION

In one aspect, a power supply controller for an instrument platform associated with a power line conductor includes an extracting means for extracting and outputting power from an electro-magnetic field generated by the power line conductor. A shunt coupled to the extracting means manages the electrical output power of the extracting means. A portion of the outputted power is stored in an energy storage means that provides a direct current (DC). Power conditioning circuitry coupled to the shunt and the energy storage means converts the output power from the extracting means and the DC input from the energy storage means to DC potentials required by circuitry of the power supply controller and the instrument platform. A communications controller is coupled to the power conditioning circuitry to transmit and receive data messages within the instrument platform and with remotely located processors and remotely located instrument platforms.

The disclosure can be implemented to realize one or more of the following advantages. The electrical instrument platform can be mounted on an energized power conductor and capable of simultaneously measuring and monitoring electrical, thermal and mechanical parameters of the conductor while communicating those values to other similar instruments and also to ground based processors located locally or remotely beyond immediate radio transmission distance. The device has the capability to process and analyze data generated from its own instruments, as well as data received from other such apparatus. The apparatus derives its power from the electro-magnetic field due to current flowing through the power conductor; the disclosure further relates a technique for operating the apparatus using stored energy (batteries) when there is inadequate or no current flow through the conductor.

One or more implementations include a means for transmitting data to remote systems. The communications may be real time, using wireless radio transceivers, and wireless cellular data technology. Both mechanisms are included in the disclosure, and both mechanisms can be used simultaneously. When fitted with a cell phone transceiver, the device can be used without local ground based equipment. A router system is embodied in the apparatus that manages the data message traffic.

The details of one or more embodiments of the invention are set forth in the accompanying drawings and the description below. Other features and advantages of the invention will become apparent from the description, the drawings, and the claims.

DETAILED DESCRIPTION

Figure 10:
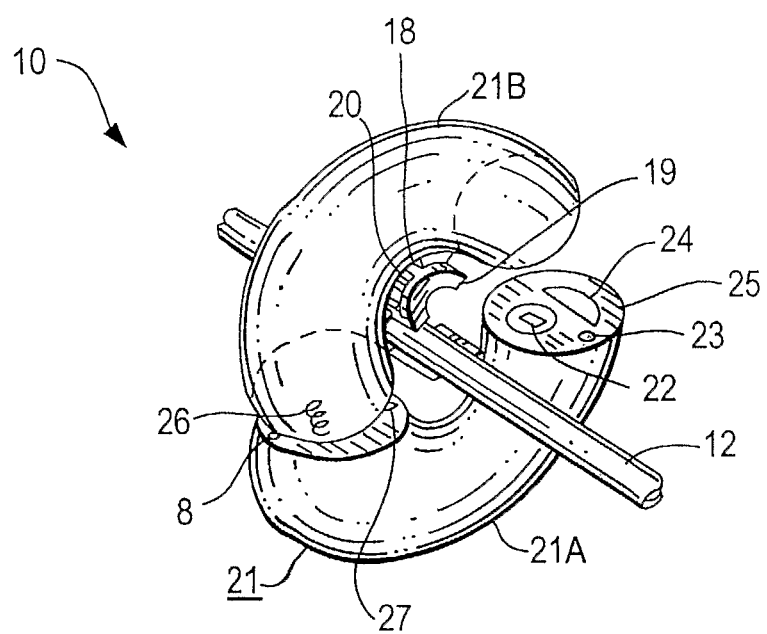
FIG. 10 is a perspective view of a power donut in an open position around a power line conductor.

FIG. 10 illustrates an implementation of a toroidal instrument platform 10 that may be disposed about a power line conductor 12. The instrument platform is used for measuring, monitoring and communicating information associated with the power line conductor. The instrument platform also has provision for receiving a power supply controller and a communication expansion adapter. The power supply controller provides power for the instrument platform and the communications control adapter provides communications between the power donut and a remote processor. A toroid housing 21 is shown in an open position and partially encompassing power line conductor 12. Housing 21 contains a current transformer 22, electronic components 24 and a Rogowski coil 23 that may be encapsulated within insulation 25. Housing 21 is hinged at one section by means of a combination of spring 26 and hinge 8. A trip mechanism 27 is operably connected with spring 26 to cause halves 21A, 21B of housing 21 to come into contact when trip mechanism 27 comes in contact with power line conductor 12, thus surrounding the power line conductor 12. Thermal sensor unit 20 attached to one end of spoke 18 is in thermal contact with power line conductor 12 for the purpose of sensing the heat generated by power line conductor 12. Rogowski-type current sensing coil 23 is a current transducer that permits measurement of current in the power line conductor 12. Current sensing coil 23 generates current in response to the magnetic field existing around power line conductor 12 and provides indicia of the magnitude of the current passing through power line conductor 12. Housing 21 can be fabricated from any suitable material, even a conductive material, such as aluminum, without disrupting the transmission of electric power through line 12.

Figure 5:
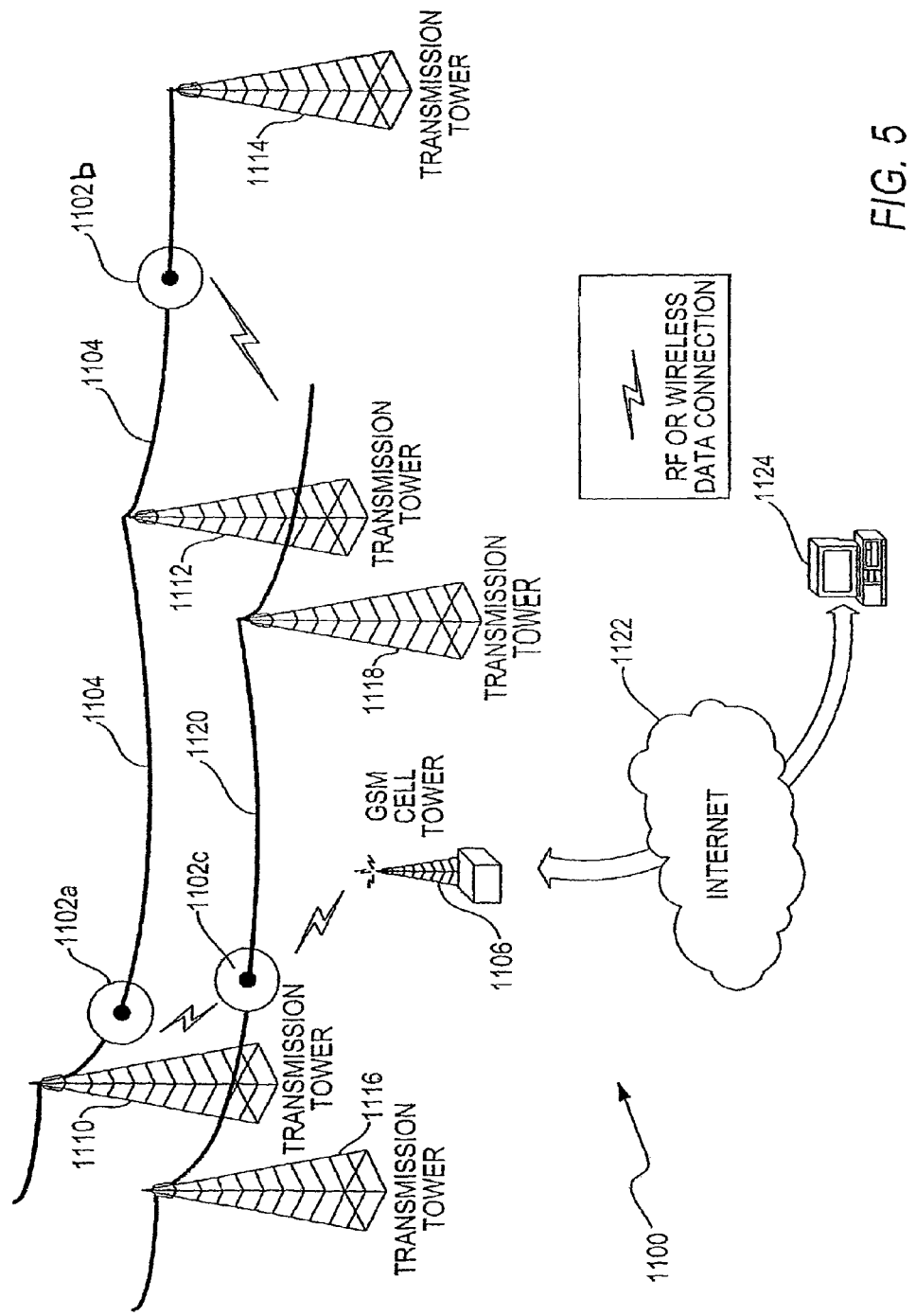
FIG. 5 is an illustration of a power line monitoring system using the present invention.

FIG. 5 illustrates an implementation of a power line conductor monitoring system 1100 using instrument platforms 1102a, 1102b, 1102c each having a power supply controller and communications control of the present application disposed therein. Instrument platforms 1102a, 1102b are mechanically mounted on a power line conductor 1104 between two power line transmission towers 1110, 1112 and 1112, 1114 respectively. Instrument platform 1102c is mounted on a power line conductor 1120 between power line transmission towers 1116 and 1118. In the system illustrated the instrument platforms 1102a, 1102b are each mounted on the same power line conductor 1104 and instrument platform 1102c is mounted on a different power line conductor 1120. However in other implementations the instrument platforms can be mounted in any arrangement on one or more power line conductors. Each instrument platform includes sensing instruments to determine data parameters associated with the power line conductor on which it is mounted. The power supply controller in each instrument platform extracts power from a magnetic field associated with current flowing through the respective power line conductor 1104, 1120. The extracted power is provided to the instrument platform sensing instruments and the communications control. The communications control of instrument platforms 1102a, 1102b transmit the data parameters determined by the respective sensing instruments to instrument platform 1102c. The communications control of instrument platform 1102c receives the data parameters from instrument platforms 1102a, 1102b and transmits the data parameters to a ground-based processor 1124 through a ground-based receiver coupled to a network 1122. The communications control of instrument platform 1102c also can transmit data parameters determined by the sensing instruments of instrument platform 1102c to the ground-based receiver. In another embodiment, the data parameters from instrument platform 1102b are transmitted to instrument platform 1102a that, in turn, forwards those data parameters on to instrument platform 1102c.

Thus, in a power line monitoring system using power supply controllers and communication controls of the present invention, each instrument platform can be powered from a power line conductor. Each instrument platform in the system can transmit its own data parameters to another instrument platform or a ground-based processor. Also, each instrument platform in the system can receive data from another instrument platform and transmit that data to a third instrument platform. Hence, only one of a plurality of instrument platforms in the system need be in communication with a ground-based processor and no external power need be provided to the instrument platforms.

Figure 1:
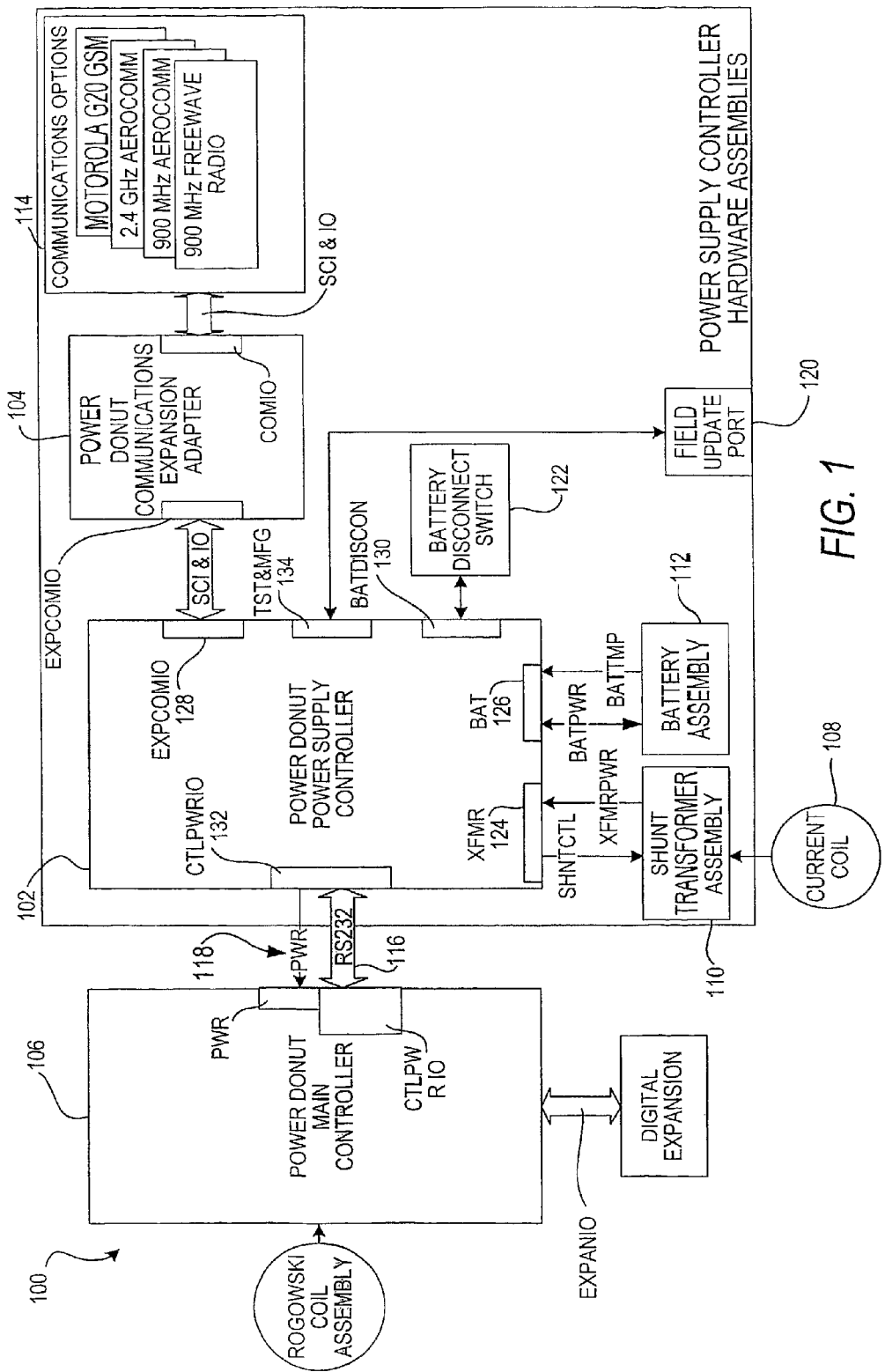
FIG. 1 is a functional block diagram of the interconnection of a power supply controller communications control adapter assembly with an external power donut.

FIG. 1 illustrates a functional block diagram 100 of the interconnection of a power supply controller (PWRSPLY) 102 and a communications control adapter (COMMEXP) Assembly 104 with an external instrument platform (main controller) 106. The main controller is an instrument platform having mechanical and electrical subassemblies for sensing, monitoring and measuring data parameters associated with a power line conductor (not shown), and is referred to herein as a "power donut" because of its particular shape, described further below. Power supply controller assembly 102 is coupled to a current transformer 108 through a shunt transformer 110. Power supply controller 102 also is coupled to an energy storage device 112, such as a rechargeable battery, and to the communications control adapter 104.

The communications control adapter 104 is an electrical and mechanical intermediary between the power supply controller 102 and a communications device 114. Communication device 114 may be one or more wireless communication options disposed on the communication expansion adapter 104. The communication device 114 includes a 900 MHz Frequency Hopping Spread Spectrum Radio, 2.4 GHz Frequency Hopping Spread Spectrum radio and GSM/GPRS Phone Module. The communications control adapter can provide communication of data from the main controller and power supply controller to external processors (not shown) through the communication device 114. The external processors can be other instrument platforms, ground-based processors or central control processors that monitor the power line conductor.

Power supply controller 102 can communicate with the main controller 106 through a network 116. A microcontroller (not shown) in the power supply controller 102 can run a software program to affect the operation of the power supply controller. Power from power supply controller 102 is provided to the main controller and on to the instrument platform on a line 118. The power supply controller 102 can include a field update port 120 to receive test and manufacturing updates and software program updates from external devices.

The function of the power supply controller 102 includes (1) preliminary power conditioning for the main controller 106, power supply for itself and communications control adapter 104, (2) communications routing to/from the main controller 106, (3) communications control of wireless devices 114, and (4) control of charging a rechargeable battery 112.

Current transformer 108 can be disposed around the power line conductor. A magnetic field produced by current flowing in the power line conductor can induce a voltage in the current transformer 108 that may be modified by shunt transformer 110 and provided to the power supply controller 102. The instrument platform can be powered by coupling with the electro-magnetic field generated when current flows in the power line conductor. The instrument platform is attached directly on the power conductor and measures current and voltage from the electrical and magnetic field surrounding the conductor. The electrical instrument platform includes the rechargeable battery 112 for powering the instrument platform when the current flow, and resultant electro-magnetic field, in the power line conductor is below a first threshold value. When the current flow is above the first predetermined threshold value, the instrument platform can be powered by electromagnetic induction from the power line conductor. When the current flow is above a second threshold value, excess current may be channeled to charge the battery 112. When a zero current condition persists in the conductor beyond a predetermined time limit, battery control circuitry and/or a software program can reduce the frequency of data transmission from the communications control adapter to the external processors, thus conserving battery power. When battery voltage drops below a predetermined level, all battery-powered transmission may be stopped until the batteries are recharged.

The interconnection of the power supply controller 102 is now described in greater detail. The interconnections within the power supply controller include:

- Transformer connector interface 124
- Energy storage device (rechargeable battery) 126
- communications control adapter 128
- Battery disconnect switch 130
- Main controller power & I/O (input/output) 132
- Test & manufacturing port—field update port 134

Transformer Connector Interface 124

The transformer interface contains signals and potentials including:

- Output potential from the current transformer 108 to supply the main controller 106 power from the power line conductor being sensed
- A signal to control the transformer shunt 110 winding control to attenuate the current transformer 108 output potential Energy Storage (Battery) Interface 126

The battery interface provides for signals and current flows including:

- Current to the battery for charging the battery
- Current from the battery for powering the instrument assembly
- A signal to indicate the battery temperature Communications Expansion Interface 128

A detailed description of the communications expansion interface is provided below under "The Power Supply Communications Expansion Interface."

Battery Disconnect Switch Interface 130

The Battery Switch interface enables a power down of the instrument platform when line power is not traversing through the power line conductor at a level sufficient to sustain operation of the instrument platform. This functionality can enable the internal battery to maintain a charge when the system is not being used.

Main Controller Power and I/O Interface 132

The main controller 106 receives power and control signals from the power supply controller 102.

Test and Manufacturing I/O/Field Update Port 134

The test and manufacturing I/O enables a user to factory program the microcontroller and update factory calibration information stored in a memory of the power supply controller. In addition, when installed in a unit, some of the signals may be route to a port the field update port, that can enable the system to be configured in the field.

When used as a field update port (FUP), the test and manufacturing interface can be wired using a harness with a reduced number of signals. These signals can be externally available to allow for testing and updates of the firmware (software program) without requiring the power donut assembly to be disassembled.

Figure 2:
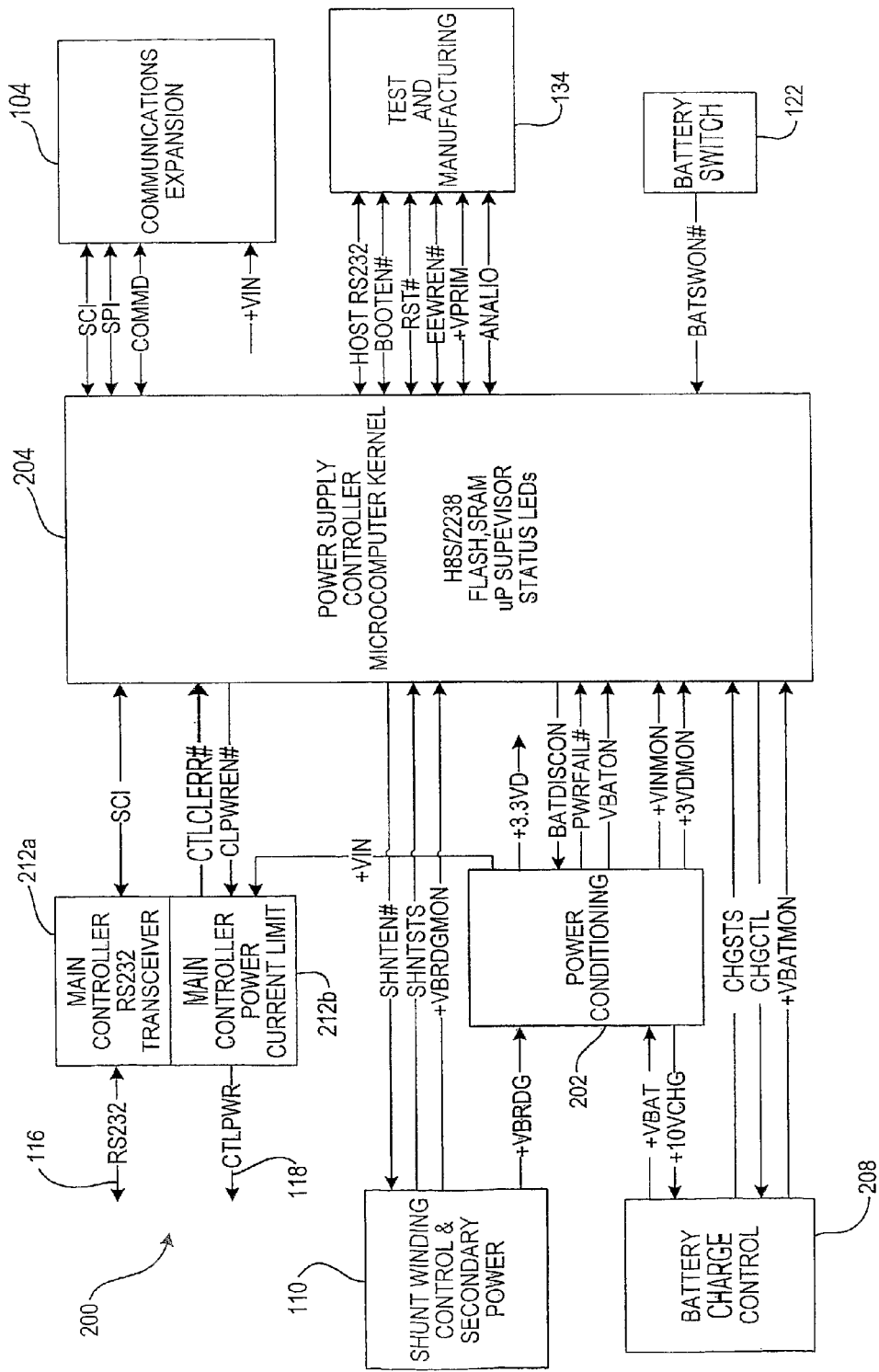
FIG. 2 is a functional block diagram of the power supply controller of FIG. 1.

FIG. 2 illustrates a functional block diagram 200 of an implementation of a power supply controller 102. The power supply controller hardware may be partitioned into functional blocks. These blocks include the power conditioner 202, microcontroller kernel 204, shunt control 110, battery charge control 208, test/manufacturing 134, main controller interface 212a, 212b and communications expansion adapter 104. The functional blocks are described herein below.

Power Conditioner

The power conditioner 202 can convert alternating current (AC) input power from the shunt control 110 and the direct current (DC) input from the battery 112 to the DC potentials required within the power supply controller 102.

Figure 3:
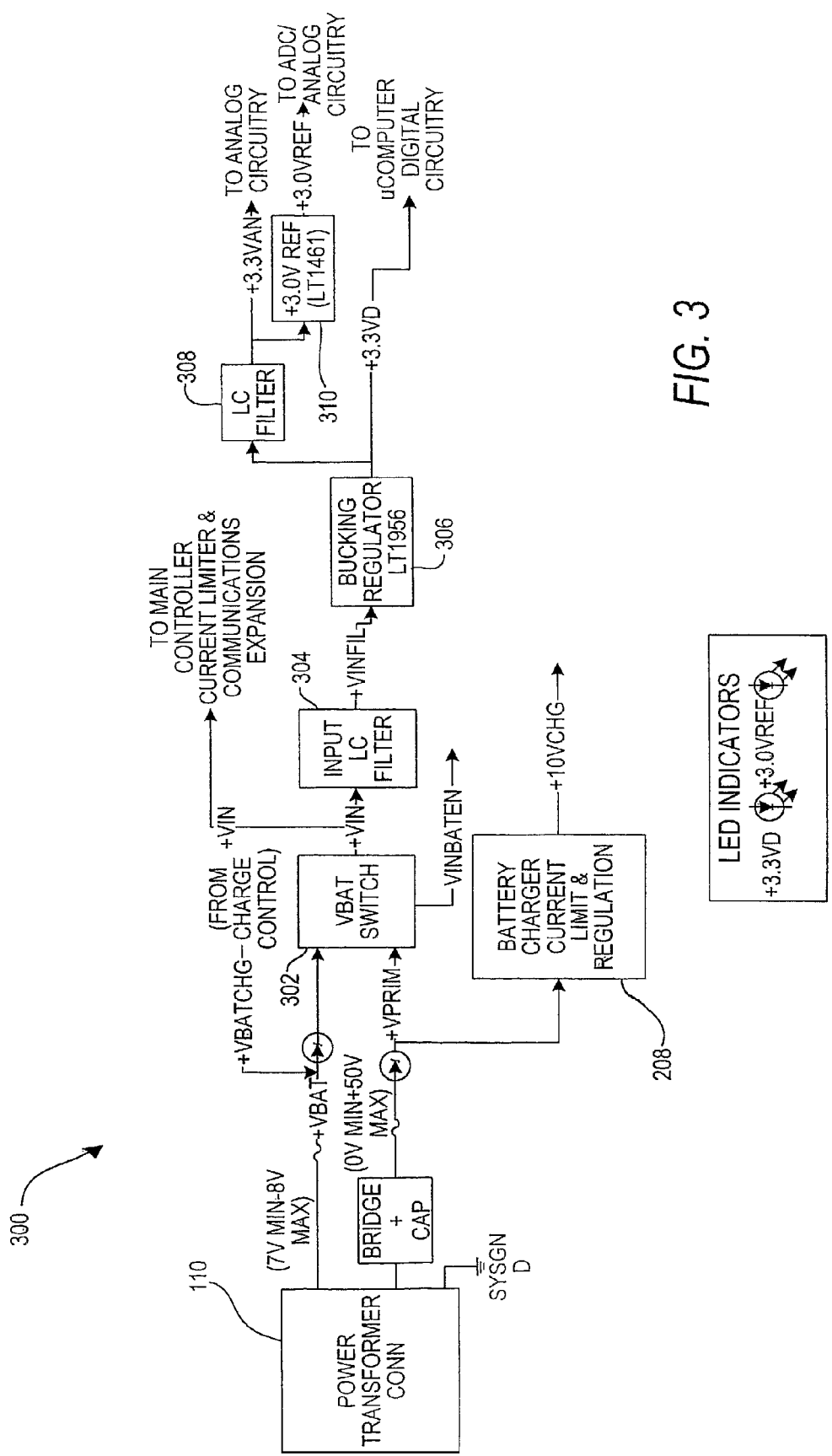
FIG. 3 is a functional block diagram of an of a power conditioner.

FIG. 3 is a functional block diagram 300 of an implementation of a power conditioner 202. A battery input (+Vbat) and a primary input (+Vprim) may be input to the Vbat switch circuitry 302. Vbat switch circuitry 302 can enable the +Vbat signal to supply power to the instrument platform when +Vprim is less than +6V. An output from this circuitry, +VIN-BATEN, is used to inform the microcontroller 208 (FIG. 2) that +VIN power is being derived from the battery input. +VIN is provided to the communication expansion adapter 104 and the main controller 106. +VIN may be further filtered using an LC circuit 304 to produce +VINFIL that has reduced high frequency noise.

+10V Charger (+10VCHG)

The battery charge control 208 requires approximately +10V that may be derived from the +Vprim signal from the current transformer 110. Power to the battery charge control 208 may be adjustable under software program control to four different current limit settings and regulated to +10V by a battery charger current limiter and regulator circuitry in the battery charge control 208.

Microcontroller Kernel

Figure 4:
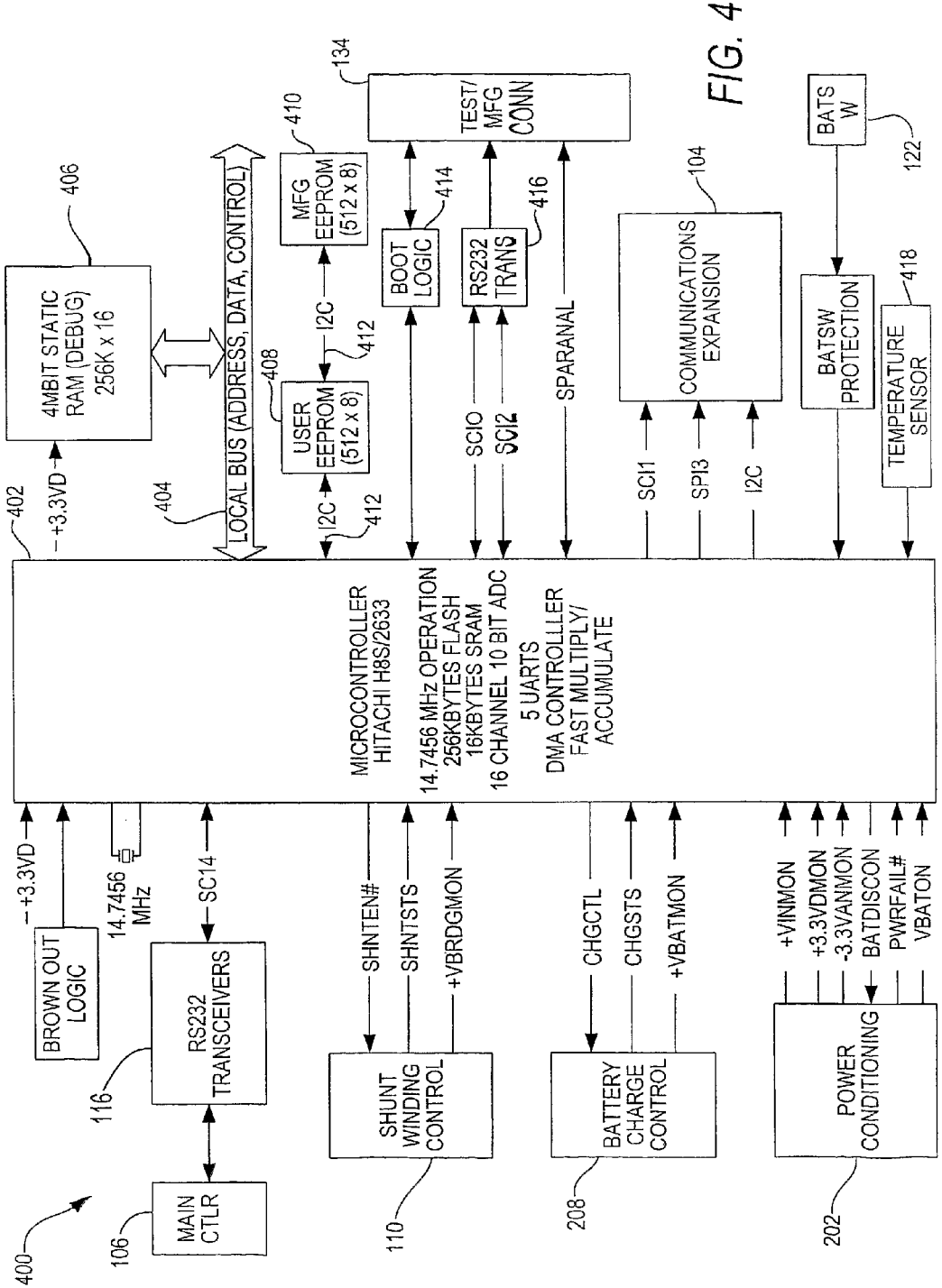
FIG. 4 is a functional block diagram of a microcontroller kernel.

FIG. 4 illustrates a functional block diagram 400 of an implementation of a microcontroller kernel 204 (FIG. 2). The microcontroller kernel 204 includes a microcomputer with peripheral support circuitry. The microcontroller kernel includes a microcontroller 402. In an implementation the microcontroller 402 is a Renesas H8S/2633 microcontroller. The microcontroller 402 can include internal flash memory (256 kbyte) and SRAM (16 kbyte). An external bus 404 also may be provided to allow for bus-oriented devices to be connected to the microcontroller 402 through a high-speed bus.

External Static Random Access Memory (SRAM)

External SRAM 406, which may be organized at 256 kbit×16, can be provided for debug and development as well as external software code/data storage. Data may only be written as words, on even addresses. Code and data constants, which may be stored in the internal flash memory, can reside in External SRAM 406.

Serial Electrically Erasable Programmable Memory (EEPROM)

Two serial EEPROM devices 408, 410 may be provided on I2C 412 bus and can be organized as 512×8 bits. A Manufacturing (MFG) EEPROM can be write-able at the factory by assertion of a write-enable signal (EEWREN) available at the test and manufacturing connector 134. The MFG EEPROM can reside at address 2 (A0=0, A1=1, A2=0) and store information not expected to change in the field. The data can be used by the power supply controller to set thresholds for the minimum power requirements for radio transmission, baud rate configuration, and other parameters.

Battery Charge Control

The battery charge control 208 can be used to charge and monitor the status of the energy storage device 112 (FIG. 1). In an implementation, the energy storage device is an integrated Lithium Ion battery pack (2 Cells). Power to the charger can be supplied from the +Vprim (FIG. 3) signal and can be current limited and voltage regulated. The microcontroller 402 can cause the battery charge control 208 to provide different charging rates under program control. The battery charge control can monitor the battery voltage and the battery temperature to regulate the charging of the battery. Charging status signals can be provided by the battery charge control 208 to the microcontroller 402.

Transformer Shunt Control

The current transformer 108 (FIG. 1) provides power to the main controller 106. The current transformer 108 is wound with a secondary and shunt winding. Transformer shunt control 110 can cause the shunt winding to be shorted and attenuate the power output of the secondary winding. The transformer shunt control thus can limit the maximum voltage output from the secondary winding that may exist under light load conditions or when high current is present on the power conduction line. The microcontroller 402 can monitor the transformer secondary voltage and, in response, control the shorting of the shunt winding by controlling the transformer shunt control winding. In an implementation, an optically isolated triac driving a higher power triac can be used to short the shunt winding.

Test and Manufacturing Port/Field Update Port

A test and manufacturing port 134 enables access for the user to factory program the microcontroller 402 internal flash memory and external MFG EEPROM 410. Boot logic circuitry 414 coupled to the port 134 can enable a user to put the microcontroller 402 into Boot Loader mode when a boot enable (BOOTEN) signal is asserted. A default microcontroller boot mode asynchronous port SCI2 can be connected to the test and manufacturing port 134 to enable RS232 level serial boot loading. Some of the signals to/from test and manufacturing port 134 can be routed to an external field update port 120 (FIG. 1). This may enable operation and field updates of the main controller and microcontroller without disassembly.

Temperature Sensor

A temperature sensor 418 can provide the microcontroller 402 with a signal associated with the internal temperature of the power supply controller.

Power Supply Communications Expansion Adapter

The communications expansion adapter 104 interface is described in detail below.

Communications Power Protection

Communication power protection cam be provided by a current limiting circuit (not shown) to isolate the communications load from the power supply controller. In an implementation, the current limit of the current limiting circuit can be set to approximately 1.0 A to allow for the worst-case continuous load supplied to the communications expansion adapter by the power supply controller.

Power Supply Communications Expansion Adapter Interface

Figure 6:
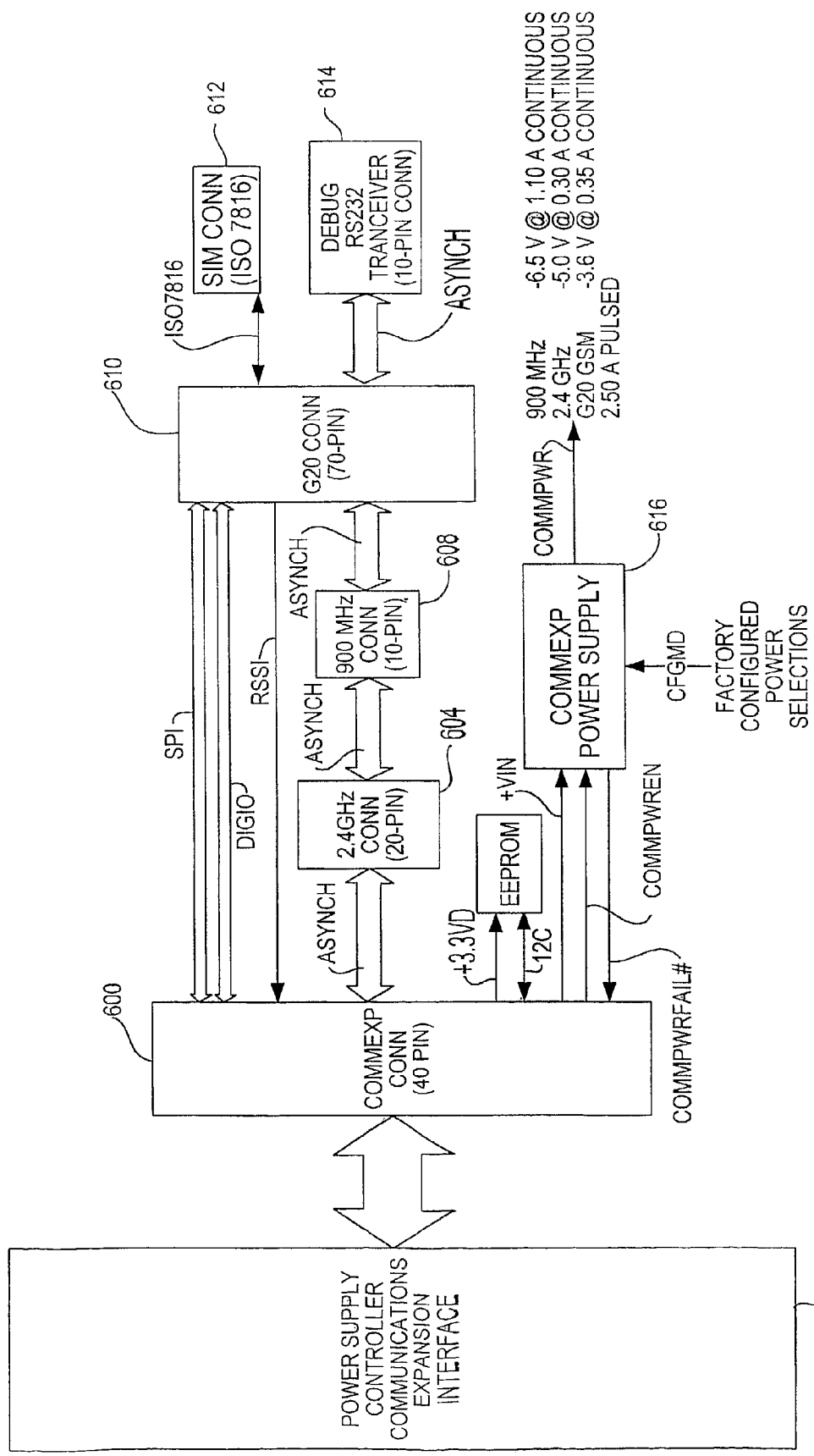
FIG. 6 is an implementation of the communications control adapter of FIG. 1.

FIG. 6 illustrates an implementation of the communications expansion adapter, which includes:
Power Supply Controller/Communications Expansion Adapter interface 600
2.4 GHz radio interface 604
900 MHz radio interface 608
GSM/GRPS Cell Phone Module interface 610
SIM Card interface 612
Debug RS232 interface 614

The communications expansion adapter interface includes:
A logic level asynchronous serial interface—H8 SCI1
A logic level SPI to interface which may be configured for Master or Slave—H8 SP13
4 logic level digital outputs
4 logic level digital inputs
An analog input to the H8
And protected +Vin power for the communications devices 900 MHz Radio The 900 MHz radio electrical interconnect 608 is an asynchronous serial interface with logic level signals. Signals may be passed from the power supply controller to the 900 MHz radio through 0Ω resistors to enable electrical isolation during test and development. The 900 MHz radio 608 interface requires substantially no electrical signal transformation from the power supply controller.

2.4 GHz Radio

The 2.4 GHz radio electrical interconnect 604 is an asynchronous serial interface with logic level signals. The interface also can include signals that allow for additional control. The signals may be passed from the power supply controller to the 2.4 GHz radio through 0Ω resistors to enable electrical isolation during test and development. The 2.4 GHz radio interface 604 requires substantially no electrical signal transformation from the power supply controller.

In an implementation, the 2.4 GHz radio can be mechanically affixed to the communications expansion adapter.

GSM G20 Module

The GSM/GPRS Cell Phone Module 610 can include an asynchronous interface with TTL levels for data/control packets, a master serial peripheral interface (SPI) port for debug information, an inter-integrated circuit (I2C) port for EEPROM configuration and a SIM card interface for GSM identification. The GSM/GPRS Cell Phone module 610 can be mechanically affixed to the communications expansion adapter 104.

GSM SIM Card Interface

The GSM/GPRS Cell Phone module 610 also can be coupled to a SIM card interface 612, which can enable the module to retrieve GSM system configuration information. Communications expansion adapter 104 can incorporate a SIM connector assembly.

Debug RS232 Transceiver Port

A Debug RS232 transceiver port 614 can be used during development to interconnect a host computer to the communications expansion adapter. The debug RS232 port 614 may be used to:
Monitor data traffic to and from the communications device 114
Emulate a communications device to allow the power supply controller to communicate with the host computer acting as the data communications equipment (DCE)
Emulate the power supply controller assembly to allow a host to act as the data terminal equipment (DTE)

Figure 7:
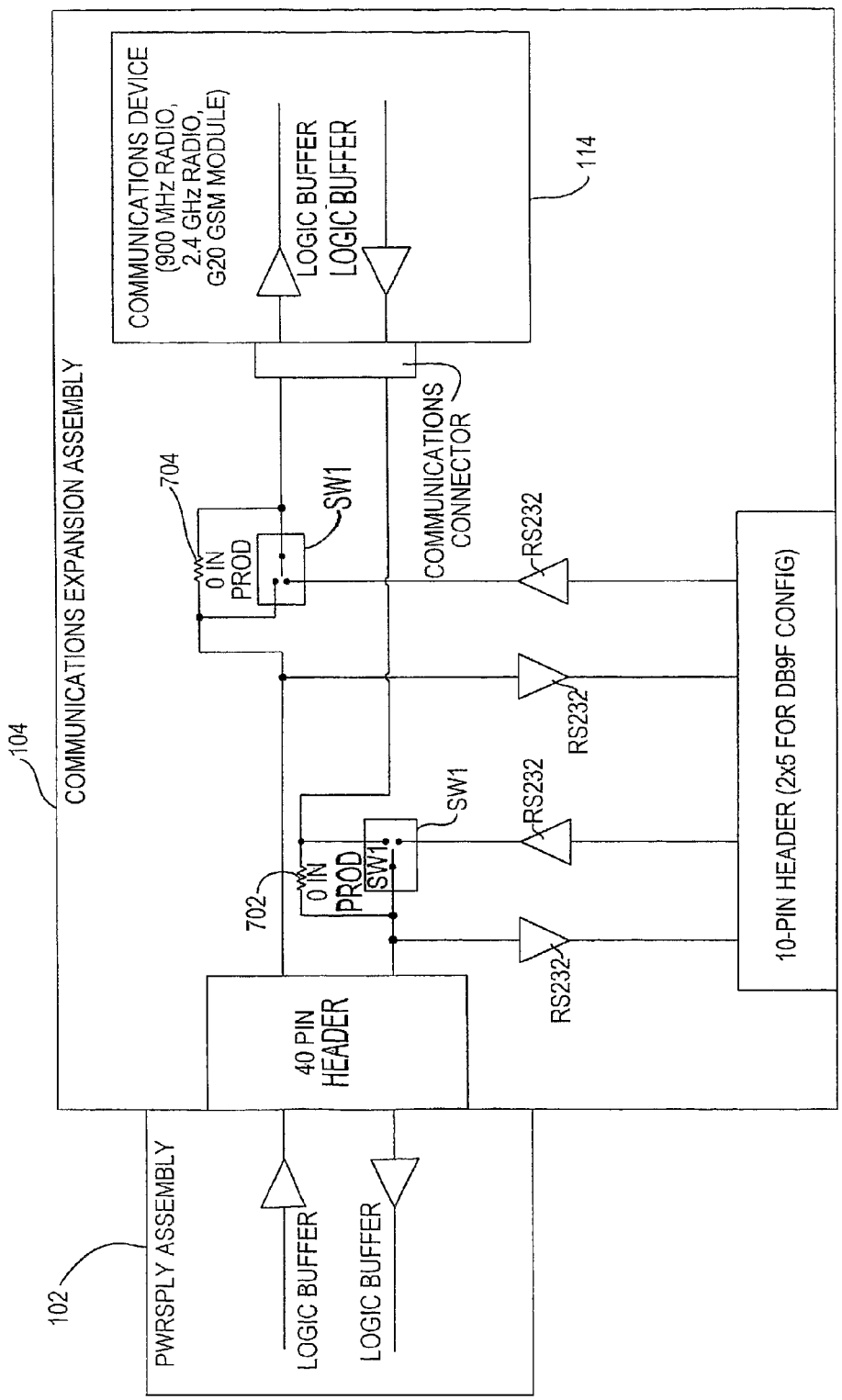
FIG. 7 is an implementation of a debug RS232 transceiver port on the communications control adapter of FIG. 6.

FIG. 7 illustrates an implementation of a debug RS232 transceiver port.

Communications Expansion Adapter Power Supply

The communications expansion adapter power supply 616 (FIG. 6) can be designed to supply power to the installed communications device 114. Input to the communications expansion adapter power supply may be supplied from the protected +Vin (FIG. 3). The power supply 616 may be configured at time of manufacture for the installed communications device 114.

Power Supply Controller Firmware Design

Figure 8:
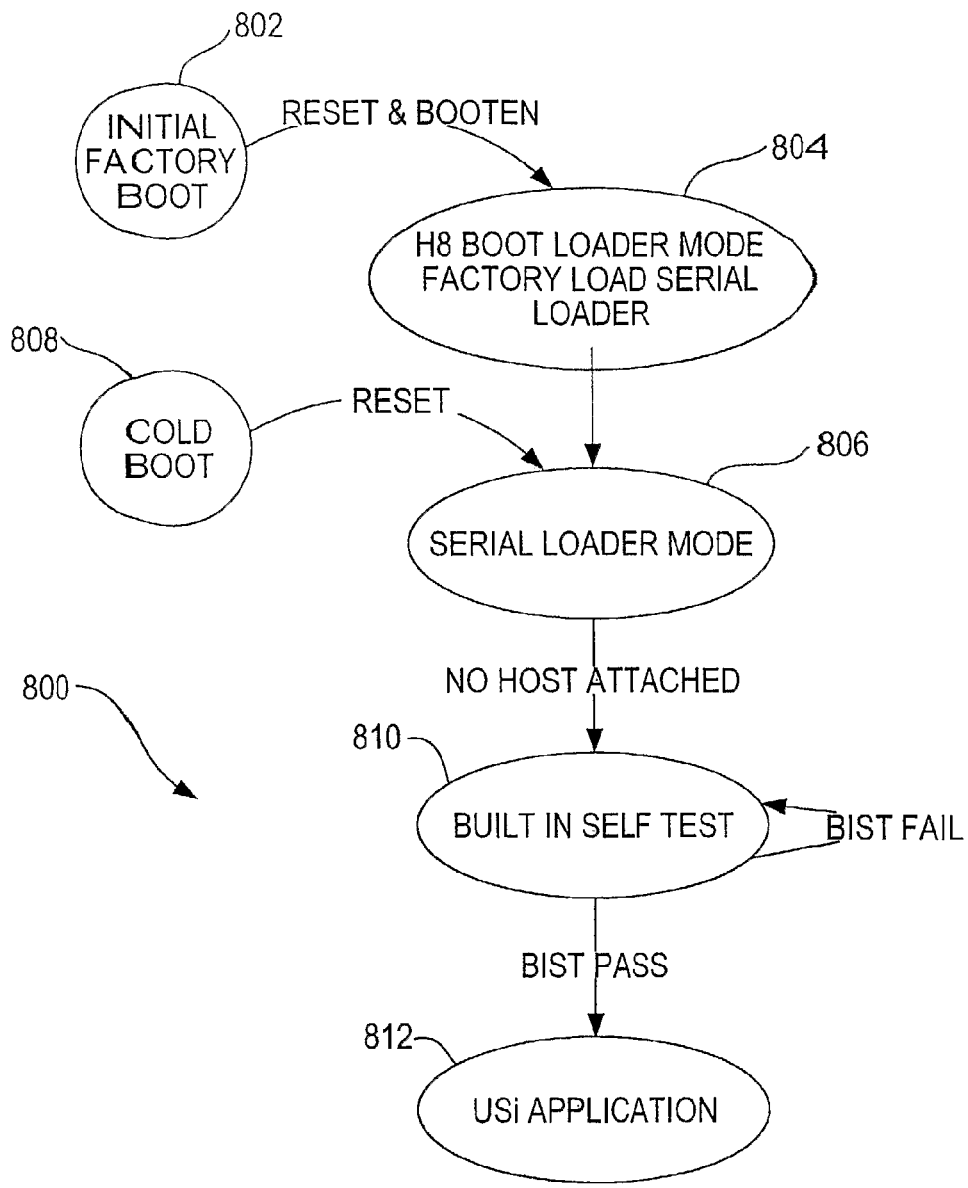
FIG. 8 is a program flow diagram of the power supply controller firmware.

Power supply controller operation is controlled by a microcontroller 402 under the control of firmware. The firmware can include two independent executable applications:
Application—loaded at the factory or in the field
serial loader—loaded at the factory FIG. 8 illustrates a program control flow diagram 800. An initial boot of the microcontroller is performed in the factory at step 802. The boot-enable (BOOTEN) may be set and the microcontroller reset. The microcontroller may be put into boot loader mode and a serial loader may be installed at time of manufacture using the test and manufacturing port at step 804. The serial loader may be updated in the field at step 806 with access to the power supply controller. Once installed, the serial loader may be invoked upon cold boots at step 808 to reset the microcontroller. The serial loader can determine when an application is present, validate the application (by a CRC or checksum) and then execute the application. The application is responsible to perform a built-in self test (BIST) at step 810 by an application program interface (API) call. When the BIST passes then program control can continue on to other applications at step 812.

The main controller application can be derived from the common code modules and an application layer. The power supply firmware can implement protocol handling functionality compatible with that of the main controller application. The power supply can also support routing of the messages based on the device address information supplied with each command including:

PWRSPLY Application
Application Programming interface
Built in Self Test
Hardware Toolkit
Hardware I/O The power supply firmware can perform the following functions:

Power Management and Control
Battery Charge Control
Support for Multiple radio interfaces
Command/Response Transaction Routing
Alert reporting
User Mode Loader Startup
Power Management and Control The power supply firmware can monitor the input power and power conditioning electronics. Status information about the power supply will be periodically transmitted to the main controller. The shunt winding of the power transformer can be controlled by the power supply firmware. The shunt winding may be enabled when the input voltage has exceeded a predetermined threshold.

Battery Charge Control

The firmware can monitor status information from the battery charging system to determine available battery power. In an implementation, battery charging at four different charging rates can also be selected programmatically. This call enable the host system to control the charging activity.

Support for Multiple Radio Interfaces

The power supply controller, through the communication expansion adapter support, can support different types of radios. The power supply can determine the type of radio connected to the radio interface on power-up by querying the information in MFG EEPROM on the communication expansion adapter. Once the radio type is known, the power supply can correctly handle power up sequences and monitoring of the communication expansion adapter. When a GSM/GPRS Cell Phone is detected, the power supply can handle the additional sequences needed to configure and dial the phone.

Command/Response Transaction Routing

The power supply firmware can act as the host to the main controller firmware. The power supply controller may inspect the routing information in any command received by the radio interface or the field update port (FUP) interface. The firmware can determine when the command is for the power supply or the main controller. When a received command is for the power supply controller, the power supply firmware can act on the command directly. When a received command is for the main controller, the power supply can pass the command on for processing. The response to the command may pass through the power supply to the radio interface and back to the ground based host system. The power supply can initiate its own commands to the main controller in order to pass information about the power supply controller to the main controller and also to receive status information from the main controller. The power supply controller may determine the power supply controller address and the address of the main controller from information stored in the power supply MFG EEPROM. The information provides the routing table for the power supply controller, these two device addresses can be set to any 16-bit value. A convention can be used where the power supply controller address is the same as the main controller address plus an offset (for example, main controller address of 0x0100, power supply address of 0x8100). This may simplify tracking of the device address information over many power donut systems.

Alert Reporting

The power supply firmware can exchange information with the main controller. When the main controller reports an alert such as a power line conductor measurement from the instrument platform, the power supply can attempt to establish a link with the ground based host system. When a GSM phone is configured on the radio interface then the power supply firmware can attempt to dial a primary phone number to report the alert. Multiple retries may be attempted when the host phone/modem does not answer. When the power supply firmware detects a busy signal at the primary phone number then a connection on a backup phone number may be established. After the power supply establishes a link with the phone, a "wake up" message may be sent to the host system, which will identify the power donut to the host. The host application will then poll for the alert information and take appropriate action(s).

User Mode Loader Startup

When the power supply controller receives a command from the radio interface to start the user mode loader, the power supply may first start the user mode loader on the main controller. When the power supply has confirmed that the user mode loader has started successfully on the main controller, the user mode loader can be initiated on the power supply. This protocol also may apply to routing information to allow a ground based host to reprogram either the power supply or main controller.

Serial Loader Firmware

Serial loader firmware can enable the user to:
Read/Write flash memory
Read/Write SRAM
Read/Write EEPROMS
Execute Code at a selected address In the factory, at time of manufacture, the first code to be loaded can be the serial loader. The serial loader is instantiated using the boot loader mode protocol available on the H8S through the test and MFG connector. Once the serial loader has been instantiated, a host computer serial port (RS232) can be used to communicate with the unit via the external communications protocol available on the asynchronous radio port. This approach will allow field updates to be made without disassembly of the power donut. The serial loader may be used to load the flash memory and EEPROM memory on the unit. The serial loader can reside in Block 0 of the microcontroller flash memory and may be write-protected at the factory. When the serial loader needs to be updated, the power donut will have to be opened and reprogrammed using the test and MFG connector.

An example of serial loader commands is shown in Table 1.

TABLE 1 serial loader Commands

| serial loader Command | Brief Description |
|---|---|
| Write flash memory | Write flash memory Memory |
| Read flash memory | Read flash memory Memory |
| Erase flash memory | Erase flash memory Memory |
| Write EEPROM | Write EEPROM Memory |
| Read EEPROM | Read EEPROM Memory |
| Write RAM | Write RAM Memory |

TABLE 1-continued serial loader Commands

| serial loader Command | Brief Description |
|---|---|
| Read RAM | Read RAM Memory |
| Execute Code | Execute Code |

The serial loader resident in the main controller can reload application code on the main controller in addition to reloading code on the power supply controller module. Therefore routing identification (module ID) will be used to indicate which controller, main or power supply, the host wishes to communicate to.

Common Code Modules

The power supply controller application firmware functions can be derived from code modules that are commonly developed for use on the main controller. The common set of functions may be reused in the power supply firmware. The power supply application can be modularized into layers including:
- Application programming interface
- Built-In Self Test
- Toolkit
- Hardware I/O These layers are now described in further detail.

Application Programming Interface (API)

An API can be used to abstract the main application firmware from underlying code modules. This API acts as delineation between the lower level layers of firmware and the target specific application firmware. The power supply controller application may make calls to API layer functions. In an implementation, no direct calls to the underlying toolkit and primitive modules are performed. API functions can return a 16-bit error code after making the call. An example of the API functions are listed in Table 2.

TABLE 2

API Function Reference

| Function Name | Description |
|---|---|
| API_INITIALIZE_M( ) | Initializes the hardware and all API functions |
| API_BACKGROUND_M | Performs any background operations required by the API. This function should be called periodically to learn ensure correct scheduling of software timers and tasks. This function also controls a watchdog timer that will reset the processor in case of errant firmware. The returned status includes any errors detected by low-level operations such as ADC buffering. |
| API_GET_FW_VERSION_M | Returns a string of information that contains the current firmware revision information. |
| API_GET_SERIAL_NUM_M | Returns a string of information that contains the current serial number of the unit. |
| API_BIST_EXECUTE_M | Executes one or more of the Built-In Self Tests. |
| API_EEPROM_READ_M | Reads either EEPROM. The manufacturing EEPROM is located first, the user EEPROM is located after the manufacturing EEPROM. |
| API_EEPROM_WRITE_M | Writes either EEPROM. The manufacturing EEPROM is located first, the user EEPROM |

TABLE 2-continued

API Function Reference

| Function Name | Description |
|---|---|
| | is located after the manufacturing EEPROM. Write operations to the manufacturing EEPROM will fail unless an external connection is made to the EEWREN# signal on the T/M header. |
| API_ANALOG_READ_M | Reads an analog value from the H8 ADC. |
| API_DIGITAL_READ_M | Reads a single digital input. |
| API_DIGITAL_WRITE_M | Writes a single digital output. |
| API_SERIAL_CONFIG_M | Configures one of the serial ports. |
| API_SERIAL_GET_RX_SIZE_M | Gets the number of bytes in the serial receive buffer. |
| API_SERIAL_CLEAR_RX_M | Empties the serial input buffer. |
| API_SERIAL_SEND_DATA_M | Sends a block of data via the specified serial port. |
| API_SERIAL_RECV_DATA_M | Receives a block of data from the specified serial port. |
| API_SERIAL_PEEK_DATA_M | Returns data from the serial receive buffer without removing it. The data remains in the buffer until RECV_DATA is called. |
| API_CONFIGURE_TASK_M | Configures one of the two real-time application tasks. |
| API_TIMER_CONFIG_M | Configures a software timer. |
| API_TIMER_CHECK_M | Checks the state of the selected timer. |
| API_TIMER_WAIT_M | Waits until a timeout of the specified timer occurs. |
| API_START_LOADER_M | Invokes the User Mode Loader. |

Built-In Self Test (BIST)

The built-in self-test can verify the operation of hardware elements of the power supply controller. These tests can be run by the application on startup to verify the hardware before attempting to initiate normal operation. An example of the tests performed by the BIST is listed in Table 3.

TABLE 3

Built In Self Tests

| Test | Description |
|---|---|
| Power | Verifies the power supply voltages |
| RAM | Performs a write/read sweep test on RAM |
| flash memory | Validates the CRC of the application in flash memory |
| External I/O | Verifies operation of the external digital I/O registers |
| EEPROM | Validates the CRC of EEPROM data structures, tests write capability |

Hardware Tool

The toolkit modules can abstract further details of the hardware environment and perform additional supporting functions. An example of the modules is listed in Table 4.

TABLE 4

Toolkit Layer Modules

| Module Name | Description |
|---|---|
| tk_cmdset.c | Implements a function interface for externally available commands |
| tk_digital.c | Adds support for external digital latches and registers |

TABLE 4-continued

Toolkit Layer Modules

| Module Name | Description |
|---|---|
| tk_eeprom.c | Handles read write sequences to the external EEPROM memory |
| tk_hdw.c | Handles system level hardware power up and initialization |
| tk_rttimer.c | Implements a microcontroller timer based system clock |

Hardware I/O

Hardware I/O are low-level primitive functions to handle specific hardware elements of the microcontroller kernel and other supporting hardware. An example of the low-level code modules is listed in Table 5.

TABLE 5

Low Level Primitive Modules

| Module Name | Description |
|---|---|
| io_adc.c | Support for the microcontroller Analog to Digital Converter |
| io_cpu.c | Supports initializing CPU operation in various modes |
| io_dac.c | Support for the H8 Digital to Analog Converter |
| io_dig.c | Support for discrete digital inputs and outputs |
| io_dtc.c | Handles configuration of the H8 Data Transfer controller |
| io_i2c.c | Implements the I2C protocol using general purpose I/O |
| io_ints.c | Handles setup and management of interrupt vectors |
| io_sci.c | Support for any of the H8 Serial communication interfaces |
| io_spi.c | Support for any of the H8 Serial Peripheral interfaces |
| io_tpu.c | Support for the H8 16-bit Timer Pulse Units |
| io_wdt.c | Support for the H8 Watchdog Timer |

Communication Protocol

An example of a basic format of a communication protocol is shown in Table 6. The format is similar for both commands and responses. In an implementation, the <STX> character is used as a start of frame marker. This is followed by comma separated command or response information. An 8-bit checksum is calculated and appended after the command information. The <EOT> character is used to indicate end of frame.

TABLE 6

Protocol Format

| # of Bytes | Context | Values ASCII | Values HEX | Description |
|---|---|---|---|---|
| 1 | <STX> | Ctrl B | 0x02 | Start of Donut Message Packet |
| Max of 4 | AAAA | "1"-"FFFF" | 0x30303031-0x46464646 | 16 Bit Recipient Device Address |
| 1 | delimiter | ',' | 0x2C | ASCII comma field delimiter |
| 1-m | Field 1 | | | Variable length data field |
| 1 | delimiter | ',' | 0x2C | ASCII comma field delimiter |
| 1-m | Field 2 | | | Variable length data field |
| 1 | delimiter | ',' | 0x2C | ASCII comma field delimiter |
| 1-m | Field n | | | add additional fields with delimiter |
| 1 | delimiter | ',' | 0x2C | ASCII comma field delimiter |
| 2 | CS | "00"-"FF" | 0x3030-0x4646 | 8 Bit checksum calculation |
| 1 | <EOT> | Ctrl D | 0x04 | End of Text Character |

Notes:
1. Parsing of the command response messages may be based on the comma delimiters. In some implementations, the 16-bit device address may not need to contain leading zeros.
2. Numeric values can be represented in HEX format. When using only numbers and uppercase letters, lower case letters will be considered an error in the protocol.
3. No "broadcast" message is supported. The power supply and main controller respond to commands specifically addressed to each device.

Figure 9:
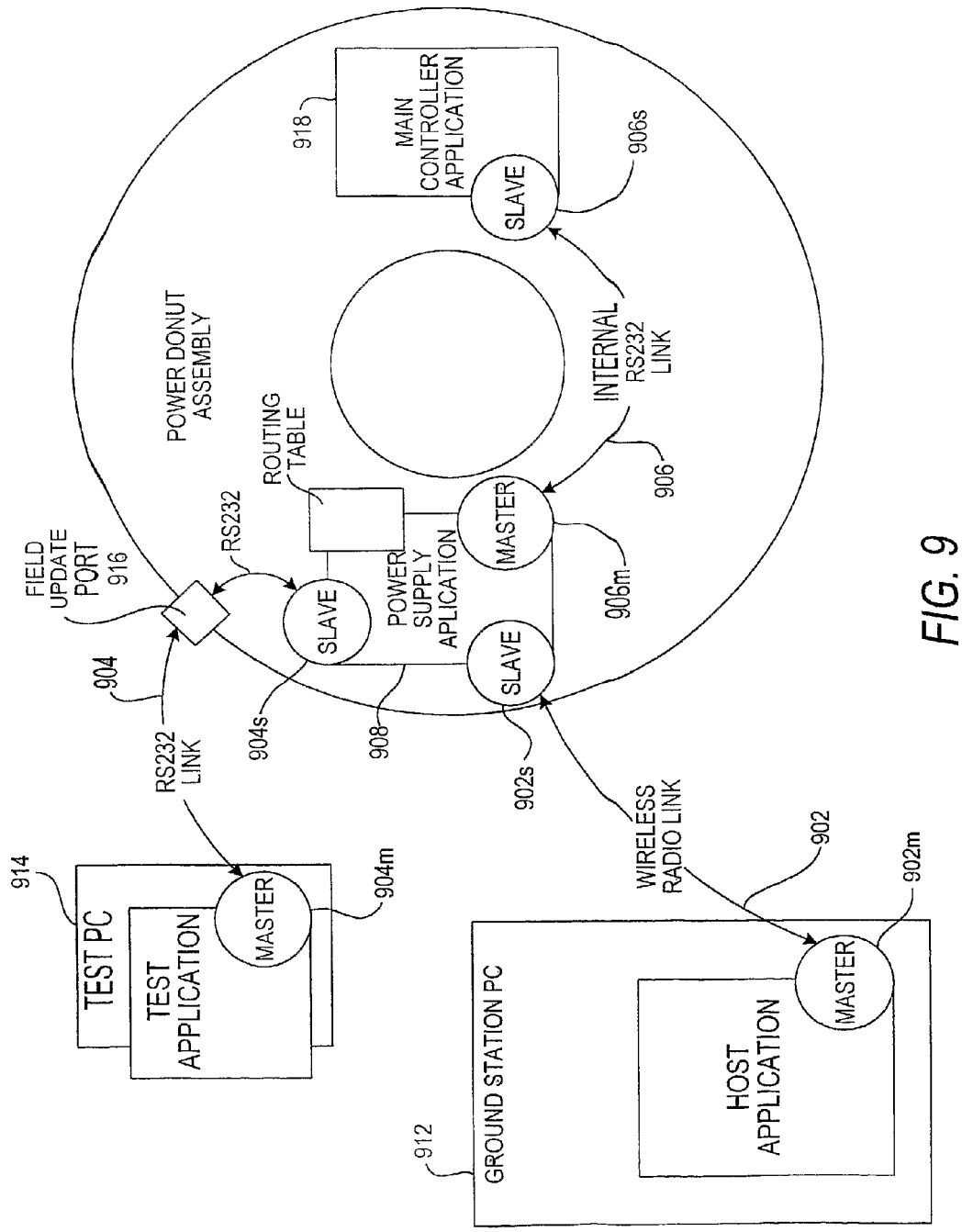
FIG. 9 is an illustration of a master/slave relationship of the communication protocol. Like reference numbers and designations in the various drawings indicate like elements.

FIG. 9 illustrates an implementation of a master/slave relationship of the communication protocol. Commands can be initiated from the master side 902m, 904m, 906m of a communication link 902, 904, 906. Power supply controller 908 can act as a slave 902s to a ground based host system 912. Power supply controller 908 also can act as a slave 904s to a test system 914 connected through the field update port 916. In the implementation illustrated, power supply controller 908 acts as a master 906m to the slave 906s of a main controller 918. As an example, commands are not initiated from the main controller 918 to the power supply controller 908 because the commands are initiated by the master 906m in the communication link 906. Information passed between the power supply controller 908 and the main controller 918 is initiated by a command from the power supply controller 908. In an implementation, when parsing incoming commands from the ground system 912, the power supply controller firmware may first isolate a single command by detecting the start and end of frame markers. When these have been found the power supply can check the checksum value to assure data integrity. The power supply may inspect the 16-bit device address to determine when the command is for the power supply controller 908 or main controller 918. No action may be taken when no address match is found and the power supply controller can begin parsing a new command. When a frame has been detected, but the checksum information is invalid, the power supply controller may flush the command from the receive buffer and no response will be transmitted.

The invention has been described in terms of particular embodiments. Other embodiments are within the scope of the claims.

What is claimed is:

1. A method for monitoring a power line conductor comprising:
storing in an energy storage device a portion of power induced from an electric field of the power line conductor resulting from current flowing in the power line conductor;
using a first instrument platform to sense at least one data parameter associated with the power line conductor; and
communicating the at least one data parameter to a second instrument platform,
using the second instrument platform to sense a data parameter associated with the power line conductor;
analyzing, at the second instrument platform, the at least one data parameter of the first instrument platform and the data parameter of the second instrument platform,
communicating, from the second instrument platform, the analyzed at least one data parameter of the first instrument platform and the data parameter analyzed at the second instrument platform to a third instrument platform, wherein the third instrument platform communicates the analyzed at least one data parameter of the first instrument platform and the data parameter analyzed at the second instrument platform with a ground-based processor;

wherein when current flowing through the power line conductor is below a first predetermined threshold value, the energy storage device provides power for the instrument platform, wherein when current flowing through the power line conductor is above the first threshold value and below a second threshold value, the electric field of the power line conductor provides power for the instrument platform and does not provide power to charge the energy storage device, and wherein when current flowing through the power line conductor is above a second predetermined threshold value greater than the first predetermined threshold value, the electric field of the power line conductor provides charging current to the energy storage device.

2. The method of claim 1, wherein the instrument platform senses a plurality of data parameters.

3. An system for monitoring a power line conductor comprising:

an energy storage device to store a portion of power induced from an electric field of the power line conductor resulting from current flowing in the power line conductor;

a first instrument platform to a sense at least one data parameter associated with the power line conductor; and a first communication device disposed in the first instrument platform to communicate the at least one data parameter to a second instrument platform, wherein the second instrument platform is enabled to sense a data parameter associated with the power line conductor, an analyzing device disposed in the second instrument platform to analyze, at the second instrument platform, the at least one data parameter of the first instrument platform and the data parameter of the second instrument platform, a second communication device disposed in the second instrument platform to communicate, from the second instrument platform, the analyzed at least one data parameter of the first instrument platform and the data parameter analyzed at the second instrument platform to a third instrument platform, wherein the third instrument platform is enabled to communicate the analyzed at least one data parameter of the first instrument platform and the data parameter analyzed at the second instrument platform with a ground-based processor wherein when current flowing through the power line conductor is below a first predetermined threshold value, the energy storage device provides power for the instrument platform, wherein when current flowing through the power line conductor is above the first threshold value and below a second threshold value, the electric field of the power line conductor provides power for the instrument platform and does not provide power to charge the energy storage device, and wherein when current flowing through the power line conductor is above a second predetermined threshold value greater than the first predetermined threshold value, the electric field of the power line conductor provides charging current to the energy storage device.

* * * * *

UNITED STATES PATENT AND TRADEMARK OFFICE
CERTIFICATE OF CORRECTION

PATENT NO. : 8,497,781 B2  
APPLICATION NO. : 11/665660  
DATED : July 30, 2013  
INVENTOR(S) : John Engelhardt et al.

Page 1 of 1

It is certified that error appears in the above-identified patent and that said Letters Patent is hereby corrected as shown below:

In the Claims

In claim 3, column 15, line 30, please remove the "a" before the word "sense".

Signed and Sealed this  
Tenth Day of September, 2013

Teresa Stanek Rea  
*Acting Director of the United States Patent and Trademark Office*